(12) United States Patent
Ikeda et al.

(10) Patent No.: US 11,486,904 B2
(45) Date of Patent: *Nov. 1, 2022

(54) ELECTRONIC MODULE

(71) Applicant: SHINDENGEN ELECTRIC MANUFACTURING CO., LTD., Tokyo (JP)

(72) Inventors: Kosuke Ikeda, Saitama (JP); Kazuyuki Sashida, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/257,177

(22) PCT Filed: Jul. 4, 2018

(86) PCT No.: PCT/JP2018/025306
§ 371 (c)(1),
(2) Date: Dec. 30, 2020

(87) PCT Pub. No.: WO2020/008544
PCT Pub. Date: Jan. 9, 2020

(65) Prior Publication Data
US 2021/0123954 A1 Apr. 29, 2021

(51) Int. Cl.
*G01R 15/18* (2006.01)
(52) U.S. Cl.
CPC ................ *G01R 15/181* (2013.01)

(58) Field of Classification Search
CPC .................................................. G01R 15/181
See application file for complete search history.

(56) References Cited

U.S. PATENT DOCUMENTS

| 11,280,812 B2 * | 3/2022 | Sashida | G01R 19/0092 |
|---|---|---|---|
| 2004/0178875 A1 | 9/2004 | Saito | |
| 2014/0159744 A1 | 6/2014 | Hozoi et al. | |
| 2018/0017599 A1 | 1/2018 | Ichikawa | |
| 2018/0172738 A1 | 6/2018 | Kashiwaya | |
| 2019/0187184 A1 * | 6/2019 | Urankar | G01R 19/0092 |

(Continued)

FOREIGN PATENT DOCUMENTS

| EP | 3715870 A1 | 9/2020 |
|---|---|---|
| JP | H07167896 A | 7/1995 |
| JP | 2001343401 A | 12/2001 |

(Continued)

OTHER PUBLICATIONS

International Search Report in the international application No. PCT/JP2018/025306, dated Sep. 18, 2018.

(Continued)

*Primary Examiner* — Christopher E Mahoney
(74) *Attorney, Agent, or Firm* — Ladas & Parry, LLP

(57) ABSTRACT

An electronic module has an electronic element 210; a connection body 250 provided on a front face of the electronic element 210; and a detection part 100 having a winding wire part 10 provided so as to surround the connection body 250, and a winding return wire part 50 connected to a terminal end part of the winding wire part 10 and returns from the terminal end part toward a starting end part.

7 Claims, 19 Drawing Sheets

(56) References Cited

U.S. PATENT DOCUMENTS

2021/0123953 A1\* 4/2021 Sashida .............. G01R 19/0092

FOREIGN PATENT DOCUMENTS

| | | | |
|---|---|---|---|
| JP | 2004119926 A | | 4/2004 |
| JP | 2007163228 A | | 6/2007 |
| JP | 2012088224 A | | 5/2012 |
| JP | 2013130571 A | | 7/2013 |
| JP | 2017152528 A | \* | 8/2017 |
| JP | 2017152528 A | | 8/2017 |
| JP | 2018101747 A | | 6/2018 |
| WO | 2005103737 A1 | | 11/2005 |
| WO | 2016190290 A1 | | 12/2016 |

OTHER PUBLICATIONS

Written Opinion of the International Searching Authority in the international application No. PCT/JP2018/025306, dated Sep. 18, 2018 and English translation provided by Google Translate.
Extended European Search Report from EP app. No. 18925535.9, dated Feb. 10, 2022, all pages.
Japanese Office Action for Japanese Patent Application 2020-528585, dated Jul. 12, 2022, and its English translation provided by global dossier.

\* cited by examiner

FIRST DIRECTION

ELECTRONIC MODULE

CROSS-REFERENCE TO RELATED APPLICATION

The present application is the U.S. national phase of PCT Application No. PCT/JP2018/025306 filed on Jul. 4, 2018, the disclosure of which is incorporated herein by reference in its entirety.

TECHNICAL FIELD

The present invention relates to an electronic module including a detection part having a winding wire part and a winding return wire part.

BACKGROUND ART

Conventionally, using a Rogowski coil has been studied as a current detection sensor. The Rogowski coil is a coreless coil, and has a winding core, a winding wire wound around the winding core, and a return wire connected to the terminal end part of the winding wire and returning to a starting end part side (for example, see JP 2012-88224 A). In addition, the Rogowski coil is connected to an integrator, and a change in current in an object to be measured can be measured by integrating the output voltage with the integrator.

On the other hand, a sensor that detects a change in the current flowing through an electronic element (for example, a switching element) included in an electronic module has been proposed. In the related art, the electronic module uses a shunt resistor to detect the current, but a space for providing the shunt resistor is required. In particular, when the current is large, such as 200 A or more, the size of the shunt resistor has increased, so that there is a problem that it is difficult to mount the shunt resistor in the electronic module and the current accuracy is poor.

SUMMARY OF INVENTION

Problem to be Solved by Invention

An object of the present invention is to accurately detect a change in a current flowing through an electronic element without the size too large.

Means for Solving Problem

[Concept 1]
An electronic module may comprise:
an electronic element;
a connection body provided on a front face of the electronic element; and
a detection part having a winding wire part provided so as to surround the connection body, and a winding return wire part connected to a terminal end part of the winding wire part and returns from the terminal end part toward a starting end part.
[Concept 2]
In the electronic module according to concept 1,
the connection body may have a head part and a pillar part extending from the head part in a thickness direction of the head part, and
the winding wire part and the winding return wire part may be provided so as to surround the pillar part.
[Concept 3]
In the electronic module according to concept 2,
the electronic element may have a first electronic element on which the pillar part is provided, and a second electronic element which is provided on the head part.
[Concept 4]
In the electronic module according to any one of concepts 1 to 3,
the electronic element may have a first electronic element and a second electronic element provided in a front face side of the first electronic element,
the connection body may have a first connection body provided on a front face of the first electronic element, and a second connection body provided on a front face of the second electronic element, and
the detection part may have a first detection part having a first winding wire part and a first winding return wire part surrounding the first connection body, and a second detection part having a second winding wire part and a second winding return wire part surrounding the second connection body.
[Concept 5]
In the electronic module according to concept 4,
the second connection body may be a connector connected to a front face of the second electronic element.
[Concept 6]
In the electronic module according to concept 4 or 5,
the first connection body may have a head part and a pillar part extending from the head part in a thickness direction of the head part,
the pillar part may be provided on a front surface of the first electronic element, and
the second electronic element may be provided on the head part.
[Concept 7]
In the electronic module according to any one of concepts 1 to 6,
the winding return wire part may not pass through the winding wire part in the detection part.
[Concept 8]
An electronic module may comprise:
an electronic element having a second element electrode provided on a back face side; and
a detection part having a first detection electrode on which the second element electrode of the electronic element is placed, a conductor part through which current flowing into the electronic element passes, a winding wire part provided so as to surround the conductor part, and a winding return wire part which is connected at a terminal end part of the winding wire part and returns from the terminal end part toward a starting end part.

EFFECT OF INVENTION

In the present invention, the detection part having the winding wire part and the winding return wire part is provided so as to surround the connection body or conductor part which is electrically connected to the electronic element. Therefore the change in the current flowing through the electronic element can be detected accurately without the size too large.

BRIEF DESCRIPTION OF DRAWINGS

In FIG. 3(a), the right part of FIGS. 3(b) and 3(c) is not shown in order to show a vertical cross section different from that of FIG. 3(b).

In FIG. 4, in order to show that the winding return wire part passes through the winding wire part, the second straight part on the front face side of the paper surface, which cannot be seen in the vertical cross section, is also shown.

EMBODIMENT OF INVENTION

First Embodiment

<<Configuration>>

Figure 1:
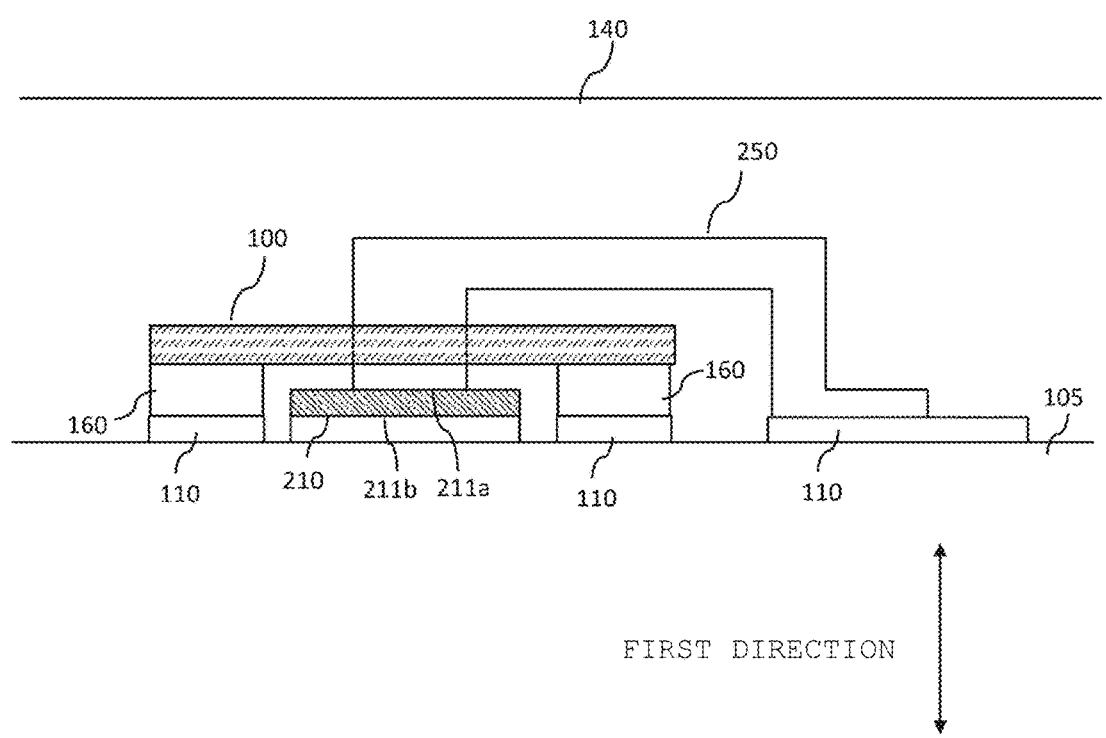
FIG. 1 is a side sectional view of an electronic module that can be used in the first embodiment of the present invention.

In the present embodiment, the "one side" means the upper side of FIG. 1, and the "other side" means the lower side of FIG. 1. In addition, the vertical direction in FIG. 1 (the direction from the other side to the one side and the direction from the one side to the other side) is referred to as the "first direction", the in-plane direction including the second direction and the third direction (see FIG. 2) orthogonal to the first direction is referred to as the "in-plane direction", and the view from above in FIG. 1 is referred to as the "plan view".

Figure 6:
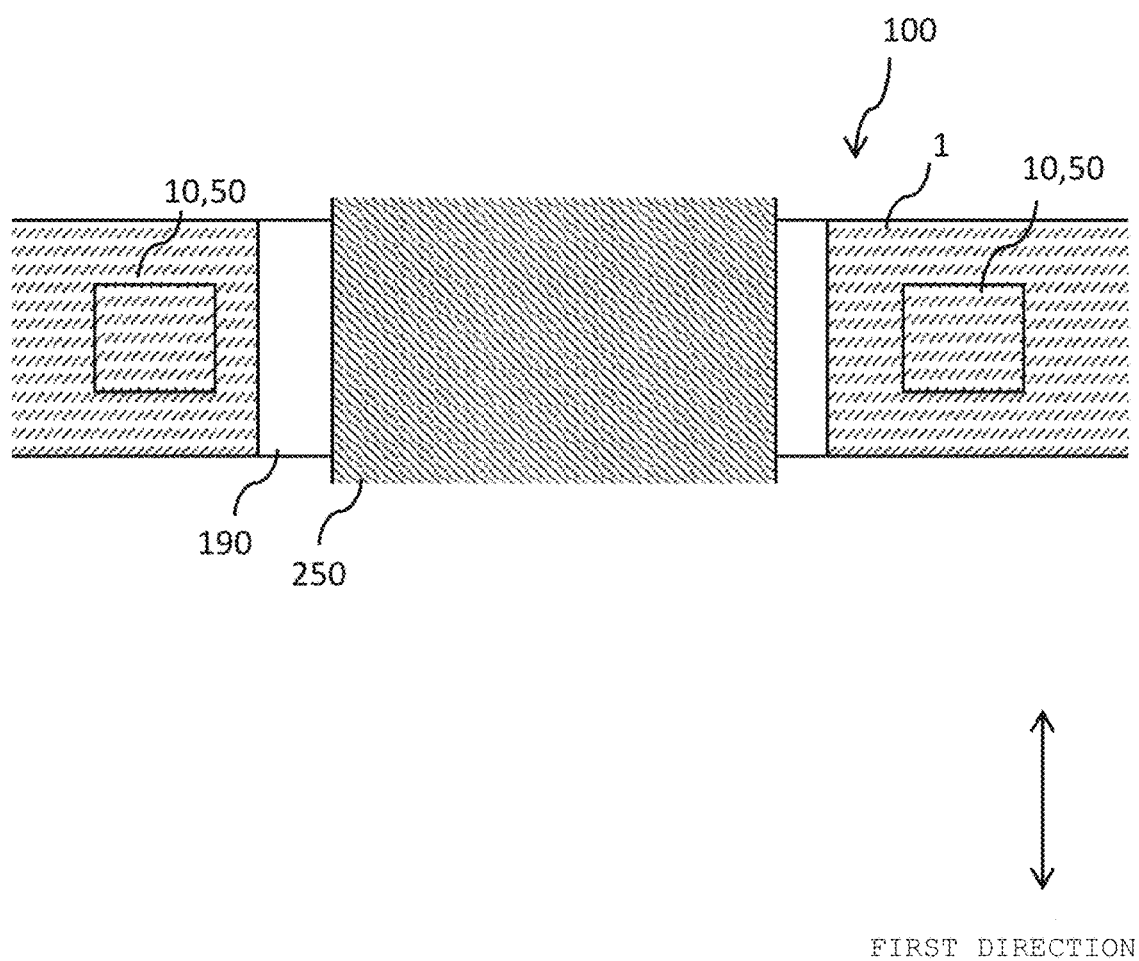
FIG. 6 is an enlarged side sectional view of part of a detection part and a connection body of the electronic module that can be used in the first embodiment of the present invention.

The electronic module of the embodiment may have a conductor layer 110 made of a metal layer such as copper, an electronic element 210 provided on the conductor layer 110 via a conductive adhesive (not shown) such as solder, a connection body 250 provided on the front face (upper face of FIG. 1) of the electronic element 210, and a detection part 100 provided so as to surround the connection body 250. The detection part 100 may have a winding wire part 10 provided so as to surround the connection body 250, and a winding return wire part 50 which is connected to the terminal end part of the winding wire part 10 and returns from the terminal end part toward the starting end part. As shown in FIG. 6, the detection part 100 may have an opening 190 through which the connection body 250 passes.

The electronic element 210 may have a first element electrode 211a on the front face and a second element electrode 211b on the back face (lower face in FIG. 1). The first element electrode 211a may be connected to the connection body 250 via a conductive adhesive, the second element electrode 211b may be connected to the conductor layer 110 via a conductive adhesive. The first element electrode 211a is, for example, a source electrode of the MOSFET, and the second element electrode 211b is, for example, a drain electrode of the MOSFET. In another example, the first element electrode 211a is, for example, a drain electrode of the MOSFET, and the second element electrode 211b is, for example, a source electrode of the MOSFET.

As shown in FIG. 1, a placement part 160 on which the detection part 100 is placed may be provided. The placement part 160 may be provided on the conductor layer 110, or the placement part 160 may be directly placed on a substrate 105 on which the conductor layer 110 is provided. The electronic module may have a sealing part 140 made of a sealing resin that seals the detection part 100, the connection body 250, and the like.

Figure 3:
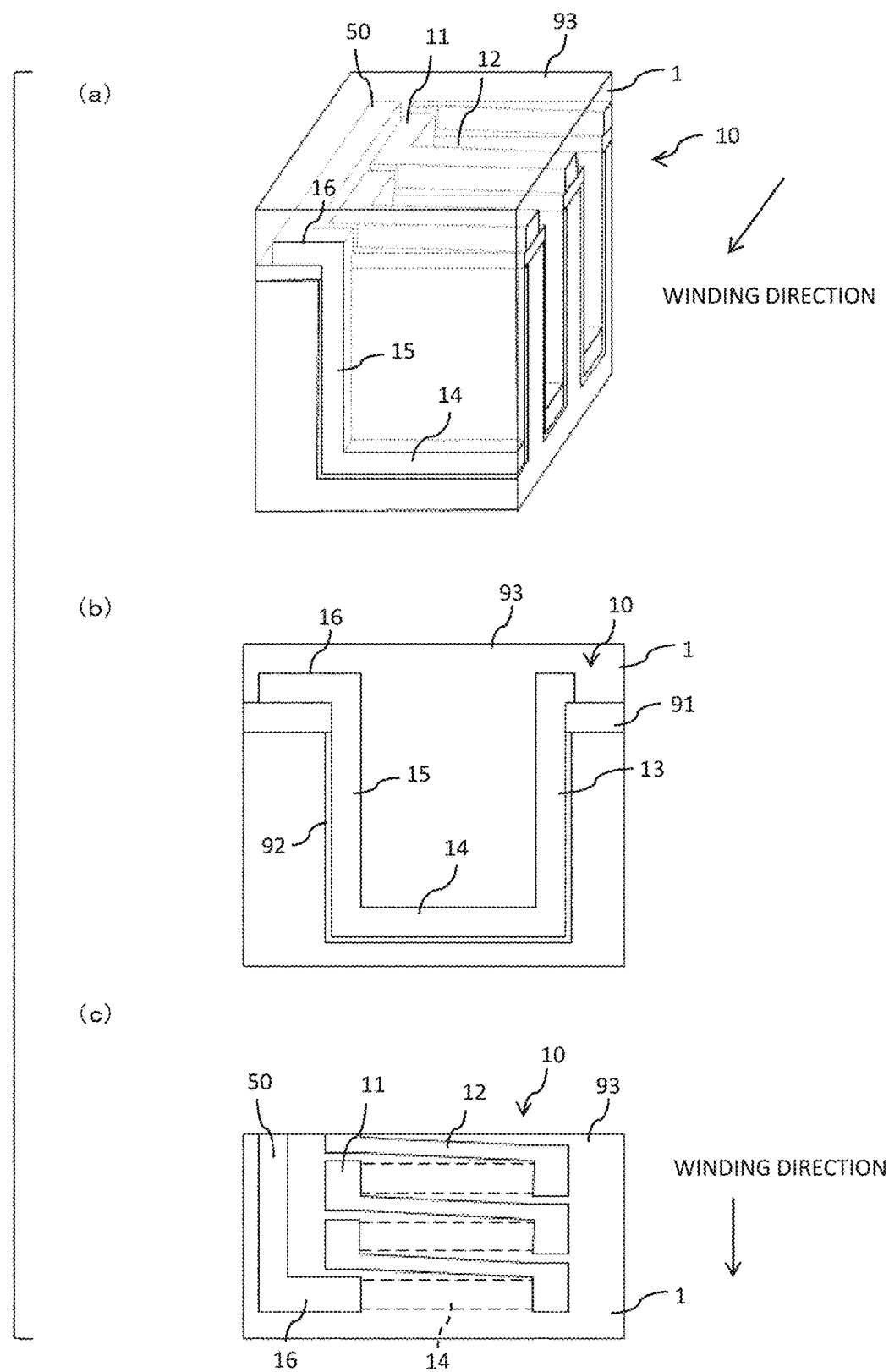
FIG. 3(a) is a perspective plane of an electronic module that can be used in the first embodiment of the present invention.
FIG. 3(b) is a vertical sectional view of the electronic module shown in FIG. 3(a)
FIG. 3(c) is a plan view of the electronic module shown in FIG. 3(a).

As shown in FIG. 3, the detection part 100 of the present embodiment may have a semiconductor layer 1, and the winding wire part 10 and the winding return wire part 50 may be formed in the semiconductor layer 1. As a material of the semiconductor, a material such as silicon, silicon carbide, gallium nitride or the like can be used.

The winding wire part 10 and the winding return wire part 50 may be formed of a semiconductor material such as polysilicon, but not limited thereto. They may be formed of a metal material such as copper and aluminum, and the metal film may be the winding wire part 10 and the winding return wire part 50.

Figure 2:
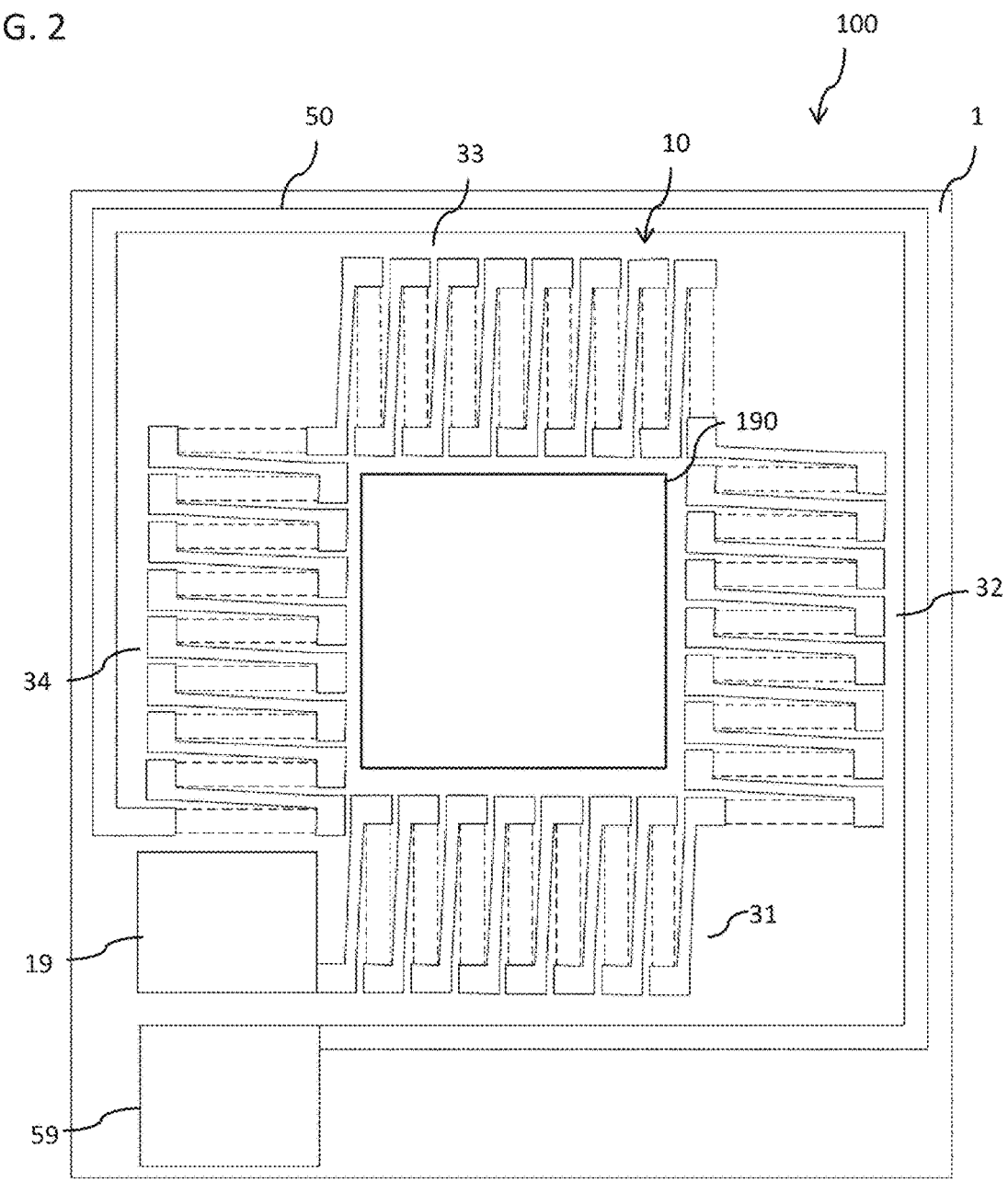
FIG. 2 is a plan view of a detection part that can be used in the first embodiment of the present invention.
Figure 2:
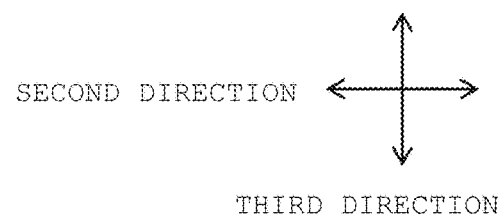

The winding return wire part 50 may not pass through the winding wire part 10. In the present embodiment, as shown in FIG. 2, the winding return wire part 50 is provided so as to surround the outer periphery of the winding wire part 10.

The inside of the winding wire part 10 may be filled with an insulating material such as an oxide film. In an aspect shown in FIG. 3, a first insulating film 91 provided on part of the outer periphery and the bottom face of the winding wire part 10, a second insulating film 92 provided on the first insulating film 91, and a third insulating film 93 that fills the inside of the winding wire part 10 are provided.

Figure 4:
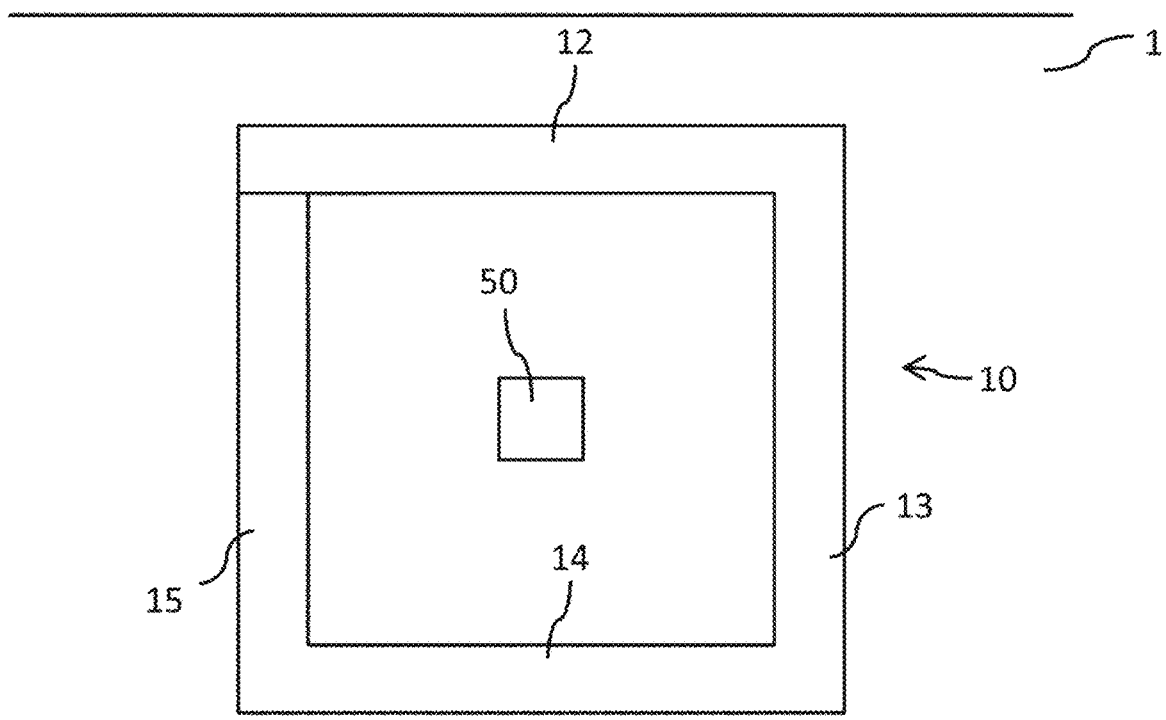
FIG. 4 is a vertical cross-sectional view of yet another detection part that can be used in the first embodiment of the present invention.

In FIG. 1, although the description is made using an aspect in which the winding return wire part 50 does not pass through the winding wire part 10, the present invention is not limited to this. As shown in FIG. 4, an aspect in which the winding return wire part 50 passes through the winding wire part 10 may be used. In the present embodiment, an aspect shown in FIG. 3 is referred to as a "pseudo Rogowski coil", and an aspect shown in FIG. 4 is referred to as a "Rogowski coil". The references numerals "10, 50" are used in FIG. 6, which means that the pseudo Rogowski coil may be used for these, or the Rogowski coil may be used. In the embodiment, although the description will be made mainly by using an aspect in which the Rogowski coil or the pseudo Rogowski coil is formed of a semiconductor material, the present invention is not limited to this. An aspect in which the Rogowski coil or the pseudo Rogowski coil is formed in a flexible substrate may be used, or the previously known Rogowski coil may be used. A change in current can be detected by using the Rogowski coil or the pseudo Rogowski coil as the detection part 100, but the detection is not limited to be performed by the change in the current. A change in another event (change in an electric signal) such as a change in the magnetic field may be detected. In this case, the change in the magnetic field due to the change in the current may be detected, or the change in the magnetic field may be detected regardless of the change in the current.

As shown in FIG. 3, the winding wire part 10 may have: a first straight part 11 along a winding direction; a second straight part 12 extending toward the peripherally inward (to the right in FIG. 3) from the end of the first straight part 11 and extending in a plane direction (direction including the second direction and the third direction) along the winding direction; a third straight part 13 extending from one side toward the other side from the end of the second straight part 12; a fourth straight part 14 extending toward the peripherally outward (to the left side in FIG. 3) from the end of the third straight part 13 and extending in the plane direction along the direction perpendicular to the winding direction; and a fifth straight part 15 extending from the other side toward one side from the end of the fourth straight part 14 (first aspect). Further, a sixth straight part 16 extending toward the peripherally outward from the end of the fifth straight part 15 in the plane direction may be provided at the terminal end part of the winding wire part 10, and the end of the sixth straight part 16 and the starting end part of the winding return wire part 50 may be connected to each other. The winding return wire part 50 may extend in the plane direction.

In an aspect shown in FIG. 3, when viewed in the vertical section, an aspect is used in which a rectangular shape is formed by a second straight part 12, a third straight part 13, a fourth straight part 14, and a fifth straight part 15, but the present invention is not limited to such an aspect. The shape may be triangular when viewed in vertical section, or it may be a polygon with more corners (pentagon or more).

Figure 5:
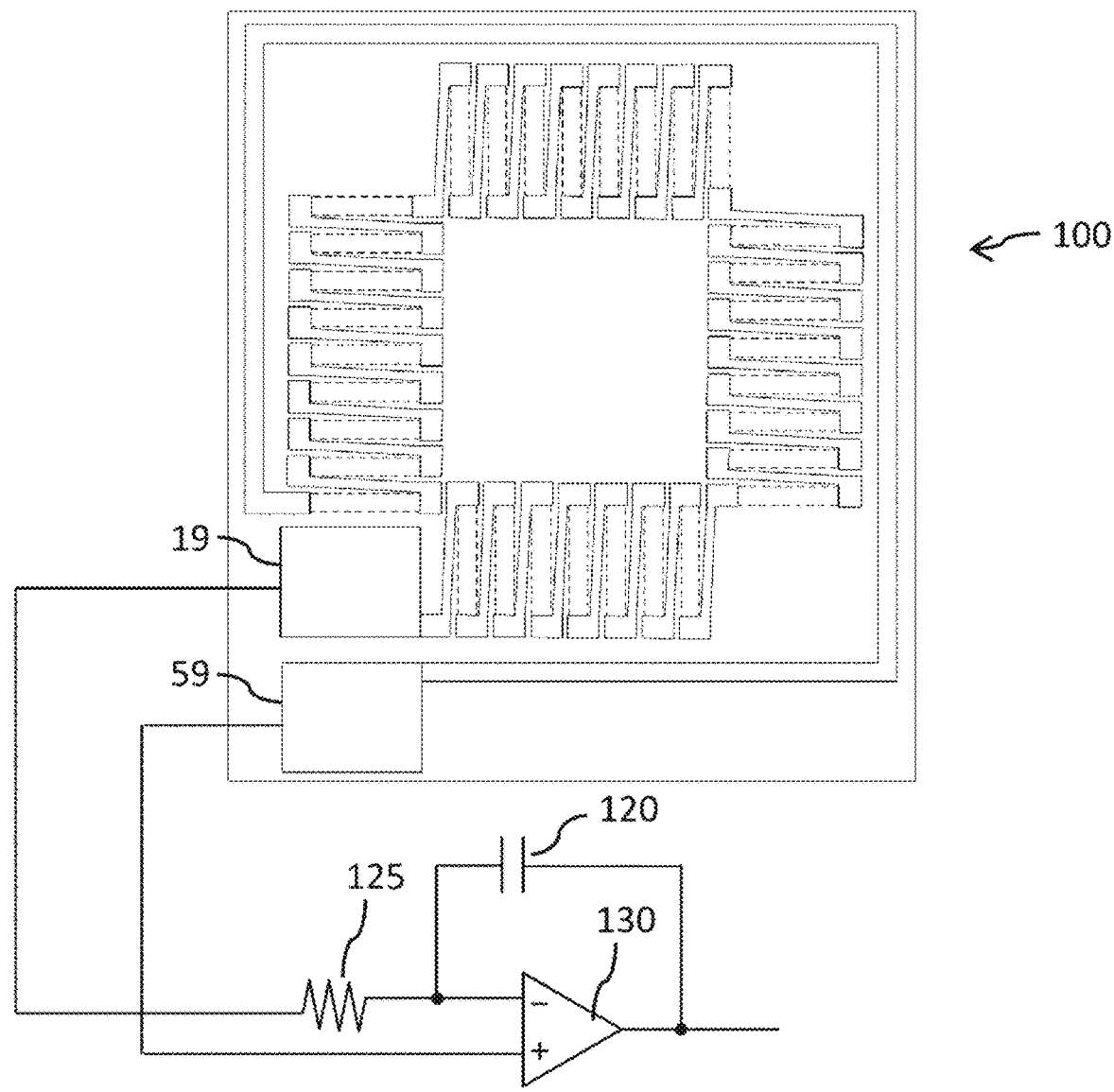
FIG. 5 is a diagram showing a relationship between a detection part and an integration circuit that can be used in the first embodiment of the present invention.

As shown in FIG. 5, the winding return wire part 50 and the winding wire part 10 of the semiconductor layer 1 of the present embodiment are connected to a resistor part 125, a capacitor 120 and an operational amplifier 130 which are provided outside, so that an integration circuit may be formed. Not limited to such an aspect, the resistor part 125 or the capacitor 120, or the resistor part 125 and the capacitor 120 of the integration circuit may be formed on the semiconductor layer 1. As an example, in FIG. 5, a winding wire electrode pad 19 connected to the starting end part of the winding wire part 10 is connected to the resistor part 125, and the resistor part 125 is connected to the capacitor 120 and the inverting input terminal of the operational amplifier 130, and a winding return wire electrode pad 59 connected to the terminal end part of the winding return wire part 50 is connected to the non-inverting input terminal of the operational amplifier 130.

As shown in FIG. 2, the winding wire part 10 may have an A-direction winding wire part 31 extending in the second direction, a B-direction winding wire part 32 connected to the end of the A-direction winding wire part 31 and extending in the third direction, a C-direction winding wire part 33 connected to the end of the B-direction winding wire part 32 and extending in the second direction, and a D-direction winding wire part 34 connected to the end of the C-direction winding wire part 33 and extending in the third direction. When the aspect described above is employed, each of the direction winding wire parts 31 to 34 can be linearly formed, which is advantageous in that they can be manufactured relatively easily. The present embodiment describes the aspect using four direction winding wire parts 31 to 34. However, the present invention is not limited thereto, and three direction winding wire parts 10 may be used to form a triangular shape in the plane direction, or five or more direction winding wire parts 10 may be used to form a polygonal shape in the plane direction.

The A-direction winding wire part 31, the B-direction winding wire part 32, the C-direction winding wire part 33, and the D-direction winding wire part 34 may correspond to each other in length. The state where they correspond to each other in length indicates that the length of the A-direction winding wire part 31, the length of the B-direction winding wire part 32, the length of the C-direction winding wire part 33, and the length of the D-direction winding wire part 34 are respectively within the range of ±5% of the average value of the A-direction winding wire part 31, the B-direction winding wire part 32, the C-direction winding wire part 33, and the D-direction winding wire part 34. The numbers of turns included in the A-direction winding wire part 31, the B-direction winding wire part 32, the C-direction winding wire part 33, and the D-direction winding wire part 34 may be the same. Since the A-direction winding wire part 31 is connected to the winding-wire electrode pad 19, the number of turns of the A-direction winding wire part 31 may be less than the numbers of turns of the B-direction winding wire part 32, the C-direction winding wire part 33, and the D-direction winding wire part 34 by, for example, one, two, or more.

<<Effect>>

Subsequently, an example of the effect according to the present embodiment configured as described above will be described. All the aspects to be described in "effect" can be employed in the above configuration.

In the embodiment as shown in FIG. 1, when an aspect in which the detection part 100 having the winding wire part 10 and the winding return wire part 50 is provided so as to surround the connection body 250 which is electrically connected to the electronic element 210 is used, the change in the current flowing through the electronic element 210 can be detected accurately without the size too large.

Specifically, when an aspect in which the winding wire part 10 is provided on the semiconductor layer 1 is used, the configuration of the winding wire part 10 can be miniaturized by using the manufacturing technology of semiconductor devices, so that the number of turns can be increased per unit length. Therefore, the change in current can be detected with high accuracy. Further, since the miniaturization is possible in this way, even when the winding wire part 10 and the winding return wire part 50 are provided on the semiconductor layer 1, it is possible to prevent the size from becoming large.

As shown in FIG. 6, when an aspect in which an opening 190 through which the connection body 250 passes is provided in the detection part 100, and the detection part 100 is provided so as to surround the connection body 250 is used, the detection part 250 can detect a change in the current flowing in the connection body 250 whose position in the in-plane direction is fixed to some extent, so that highly accurate detection can be realized.

As shown in FIG. 2, when an aspect in which the winding return wire part 50 does not pass through the winding wire part 10 is used, the configuration is very advantageous in that the manufacturing process can be facilitated. In other words, as shown in FIG. 4, when an aspect in which the winding return wire part 50 passes through the winding wire part 10 is used, the process of forming the winding return wire part 50 in the winding wire part 10 is complicated, so that the manufacturing cost goes up. On the other hand, when the winding return wire part 50 is not formed in the winding wire part 10, the manufacturing process can be performed much easier, so that the configuration is advantageous in that the manufacturing cost can be reduced.

When the electronic element 210 is a switching element such as a MOSFET, the current changes when switching between ON and OFF, so that it is advantageous to employ the quasi Rogowski coil and the Rogowski coil in the present embodiment.

When as shown in FIGS. 3(a) and 3(b), an aspect is employed in which the height positions of the first straight part 11, the second straight part 12, and the sixth straight part 16 of the winding wire part 10, and the height position of the winding return wire part 50 are the same, this is advantageous in that the same steps can be used for these. That is, this is advantageous in that a forming process can be performed by stacking the conductive material on the upper face of the first insulating film 91 and etching the conductive material.

In this embodiment, when an aspect is employed in which the winding return wire part 50 can be positioned outward of the periphery of the winding wire part 10, this is advantageous in that the winding wire part 10 can be disposed as close as possible to the current flowing between the first element electrode 61 and the second element electrode 62.

Second Embodiment

Next, a second embodiment of the present invention will be described.

Figure 7:
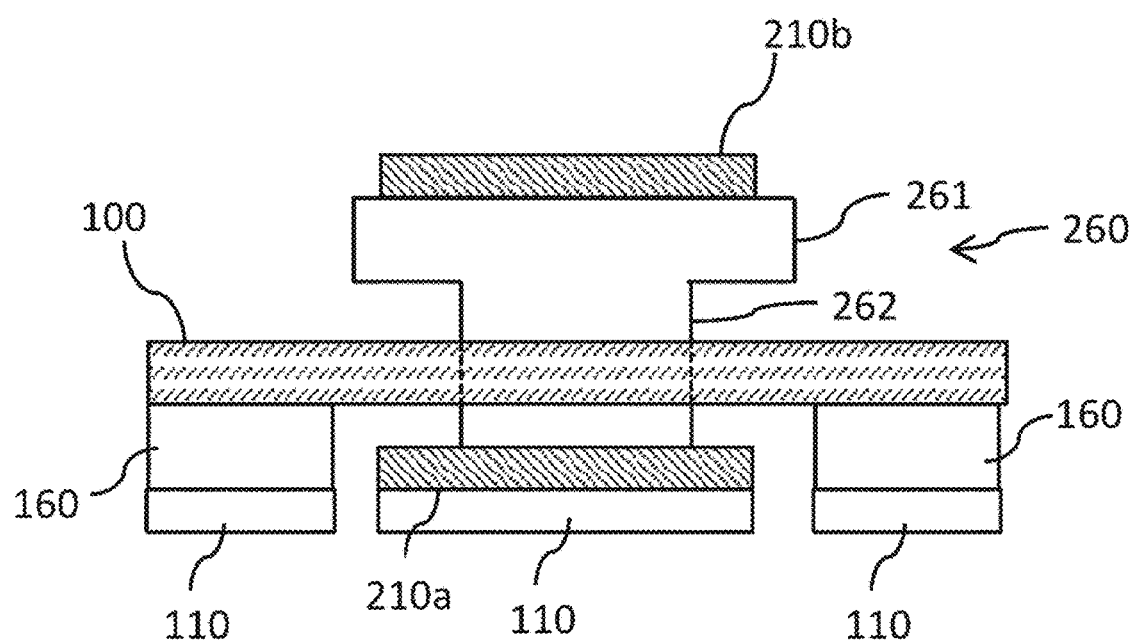
FIG. 7 is a side sectional view of an electronic module that can be used in the second embodiment of the present invention.

In the embodiment, as shown in FIG. 7, a connection body 260 has a head part 261 and a pillar part 262 extending from the head part 261 in the thickness direction of the head part 261. The winding wire part 10 and the winding return wire part 50 of the detection part 100 are provided so as to surround the pillar part 262 passing through the opening 190. The electronic element 210 may have a first electronic element 210a and a second electronic element 210b provided in the front face side of the first electronic element 210a. The pillar part 262 may be provided on the first electronic element 210a, and the second electronic element 210b may be provided on the head part 261. Any configuration used in the first embodiment can also be used in the second embodiment. The members described in the first embodiment will be described with the same reference numerals.

According to the embodiment, the first electronic element 210a and the second electronic element 210b can be laminated and disposed, and the detection part 100 can detect a change in the current flowing between the first electronic element 210a and the second electronic element 210b. The second electronic element 210b can be disposed in a stable state by providing the head part 261 as in the present embodiment, and the size of the opening 190 is not increased by providing the pillar part 262. As a result, the winding wire part 10 and the winding return wire part 50 can be provided in a compact state in the in-plane direction.

Each of the first electronic element 210a and the second electronic element 210b may be a switching element such as a MOSFET. In this case, for example, the source electrode provided on the front face of the first electronic element 210a and the drain electrode provided on the back face of the second electronic element 210b may be connected through the connection body 260. As another example, the drain electrode provided on the front face of the first electronic element 210a and the source electrode provided on the back face of the second electronic element 210b may be connected through the connection body 260.

Third Embodiment

Next, a third embodiment of the present invention will be described.

Figure 8:
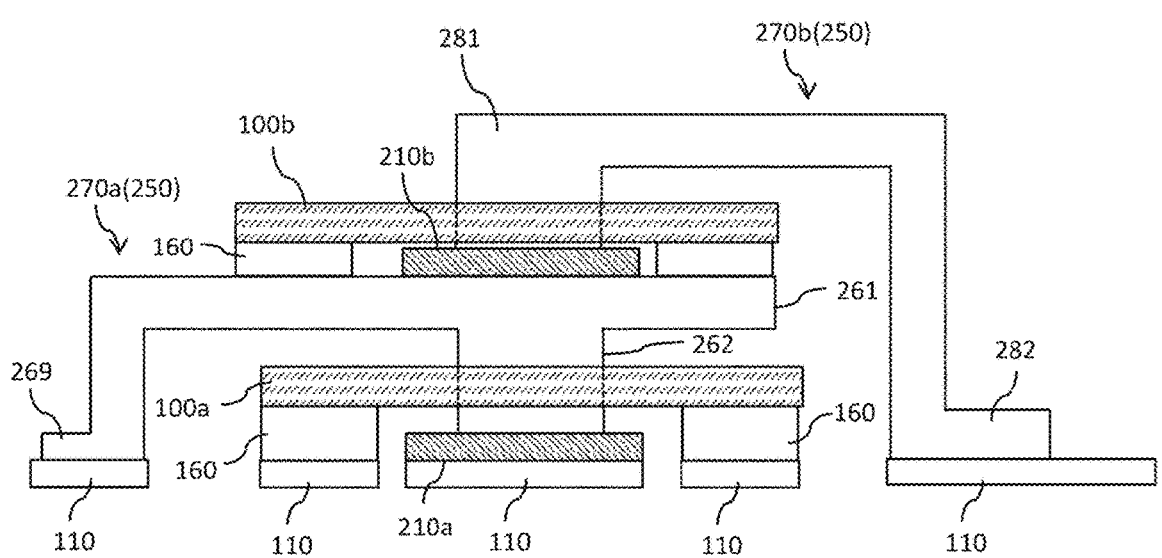
FIG. 8 is a side sectional view of an electronic module that can be used in the third embodiment of the present invention.
Figure 9:
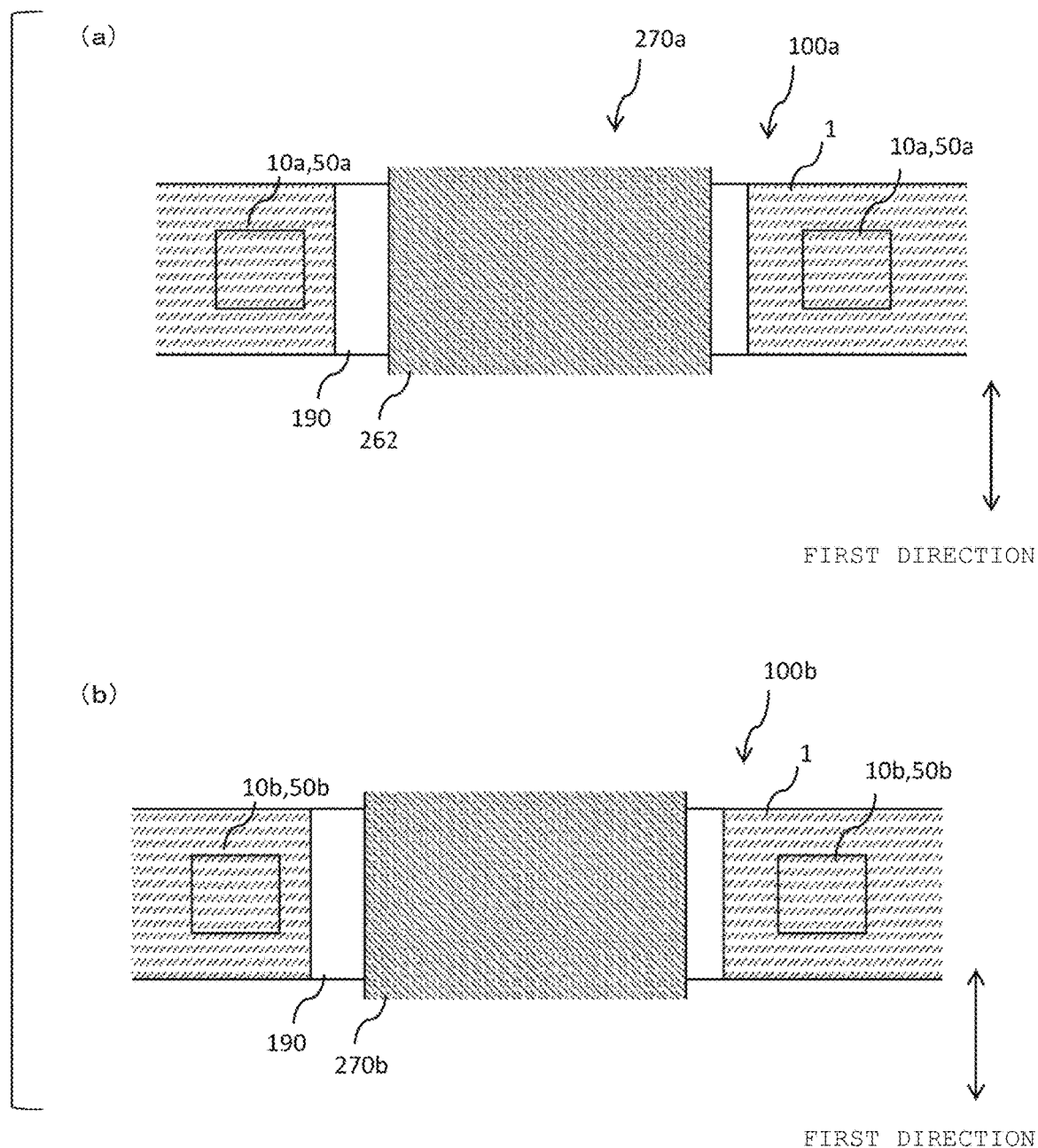
FIG. 9(a) is an enlarged side sectional view of part of a first detection part and a first connection body that can be used in the third embodiment of the present invention.
FIG. 9(b) is an enlarged side sectional view of part of a second detection part and a second connection body that can be used in the third embodiment of the present invention.

In each of the above embodiments, as shown in FIG. 8, the connection body 250 has a first connection body 270a provided on the front face of the first electronic element 210a, and a second connection body 270b provided on the front face of the second electronic element 210b. As shown in FIG. 9, the detection part 100 has a first detection part 100a having a first winding wire part 10a and a first winding return wire part 50a surrounding the first connection body 270a, and a second detection part 100b having a second winding wire part 10b and a second winding return wire part 50b surrounding the second connection body 270b. As an example, the second connection body 270b is a connector connected to the front face of the second electronic element 210b. The second connection body 270b has a second connection distal end part 281 passing through the opening 190 of the second detection part 100b, and a second connection proximal end part 282 provided on the conductor layer 110 via a conductive adhesive. The first connection body 270a has the head part 261, the pillar part 262 extending from the head part 261 in the thickness direction of the head part 261, and a first connection proximal end part 269 provided on the conductor layer 110 via a conductive adhesive. The pillar part 262 is provided on the front face of the first electronic element 210a, and the second electronic element 210b is provided on the head part 261.

According to the embodiment, the first electronic element 210a and the second electronic element 210b can be laminated and disposed, and the first detection part 100a can detect a change in the current flowing between the first electronic element 210a and the second electronic element 210b. Further, the second detection part 100b can detect the change in the current flowing through the second electronic element 210b. Therefore, according to this aspect, it is possible to more reliably detect the change in current with respect to each of the first electronic element 210a and the second electronic element 210b laminated.

The size of the second connection distal end part 282 of the second connection body 270b and the size of the pillar part 262 of the first connection body 270a may be substantially the same. When such an aspect is used, the configuration is advantageous in that a change in the current flowing through the second connection distal end part 282 and a change in the current flowing through the pillar part 262 of the first connection body 270a can be detected with the same degree of accuracy. Specifically, when the first detection part 100a and the second detection part 100b are made of the same member, the configuration is advantageous in that it is possible to detect a change in the current flowing through the second connection distal end part 282 and a change in the current flowing through the pillar part 262 with substantially the same accuracy by making the sizes of the second connection distal end part 282 and the pillar part 262 substantially the same in this way. Note that the fact that the "sizes" are "almost the same" means that the difference between the two "sizes" is within 5% of the larger "size". The fact that the size W1 and the size W2 (W1≥W2) are substantially the same means that W1×0.95≤W2≤W1.

Fourth Embodiment

Next, a fourth embodiment of the present invention will be described.

Figure 10:
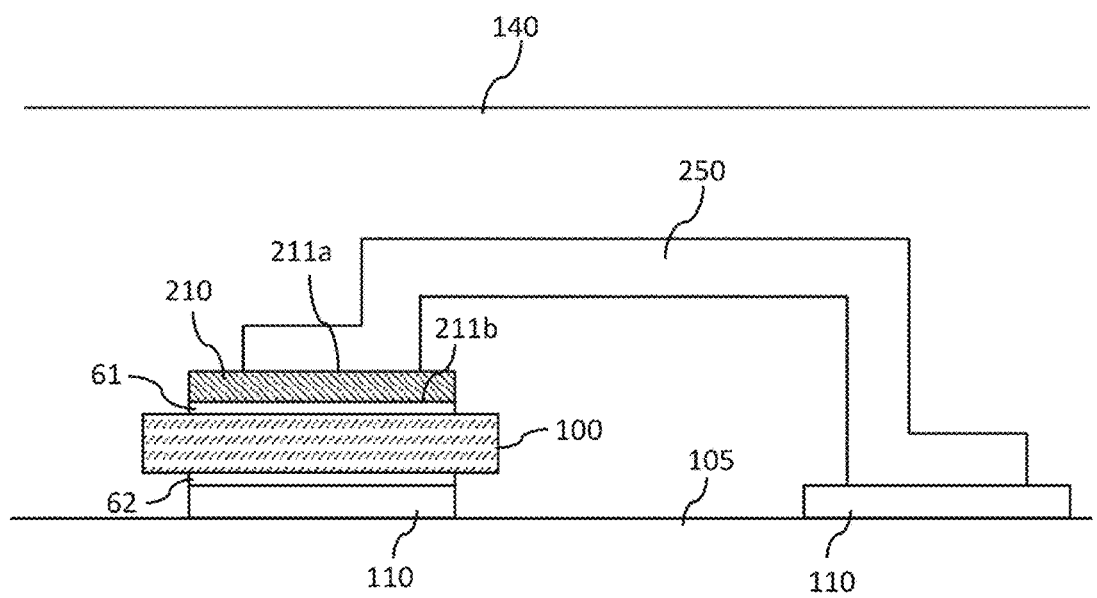
FIG. 10 is a side sectional view of an electronic module that can be used in the fourth embodiment of the present invention.
Figure 11:
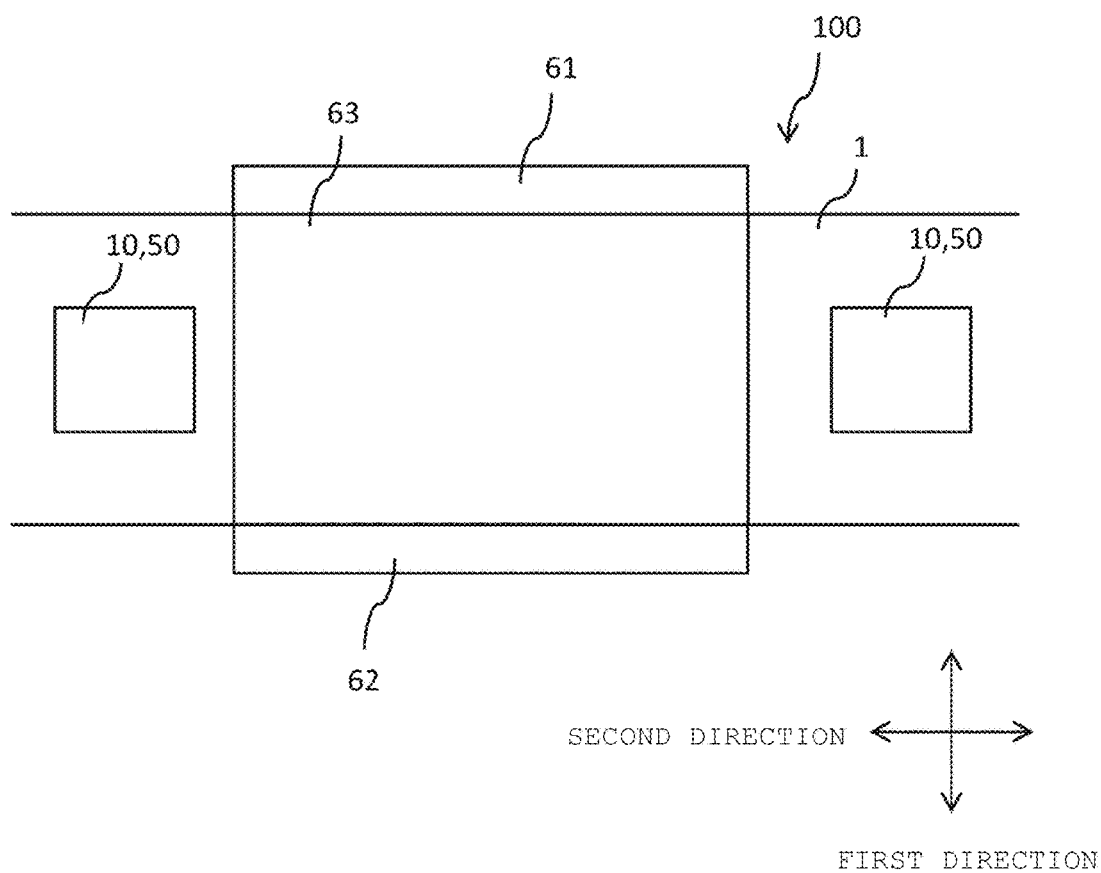
FIG. 11 is a side sectional view of a detection part that can be used in the fourth embodiment of the present invention.

In the embodiment, as shown in FIG. 10, the electronic element 210 having the second element electrode 211b provided on the back face side, and the detection part 100 on which the second element electrode 211b of the electronic element 210 is placed may be provided. As shown in FIG. 11, the detection part 100 of the present embodiment has a first detection electrode 61 on which the second element electrode 211b of the electronic element 210 is placed, a conductor part 63 through which the current flowing into the electronic element 210 passes, the winding wire part 10 provided so as to surround the conductor part 63, and the winding return wire part 50 which is connected at the terminal end part of the winding wire part 10 and returns from the terminal end part toward the starting end part. Any configuration used in each of the above embodiments can also be used in the embodiment. The members described in each of the above embodiments will be described with the same reference numerals.

The detection part 100 may have a second detection electrode 63 on the back face side. The second detection electrode 63 may be placed on the conductor layer 110 via a conductive adhesive. The conductor part 63 may be made of a metal material or a semiconductor material. When the conductor part 63 is made of a semiconductor material, an aspect may be used in which the impurity concentration of the conductor part 63 is higher than that of the semiconductor layer 1 in the peripheral region surrounding the conductor part 63.

Figure 12:
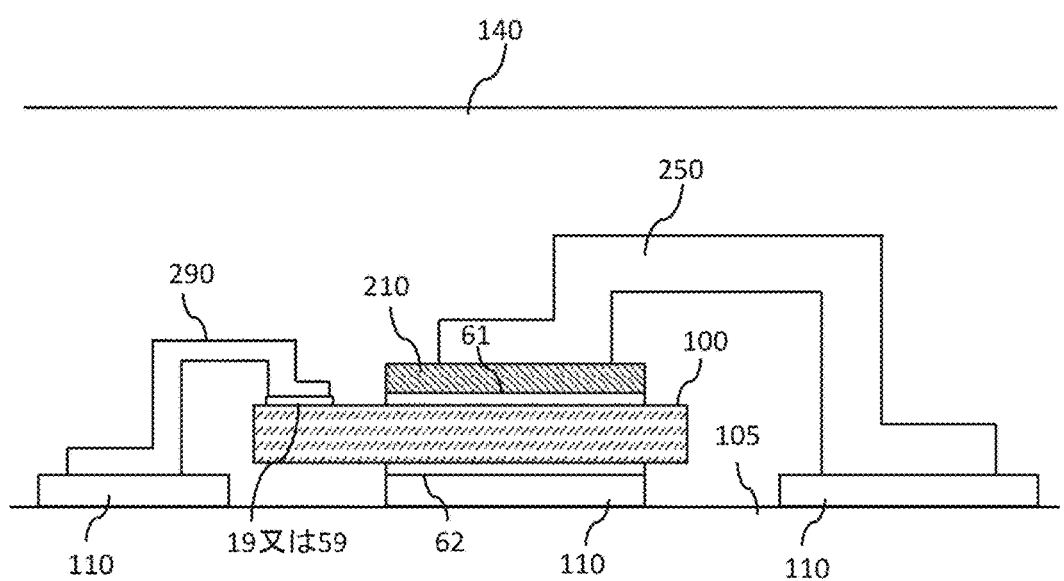
FIG. 12 is a side sectional view of an electronic module that can be used in the fourth embodiment of the present invention in an aspect different from that of FIG. 10.

As shown in FIG. 12, a connector 290 connected to the winding wire electrode pad 19 and/or the connector 290 connected to the winding return wire electrode pad 59 may be provided. In this case, the resistor part 125, the capacitor 120, and the operational amplifier 130 may be connected to the winding wire part 10 and the winding return wire part 50 through the connector 290 and the conductor layer 110.

Fifth Embodiment

Next, a fifth embodiment of the present invention will be described.

Figure 13:
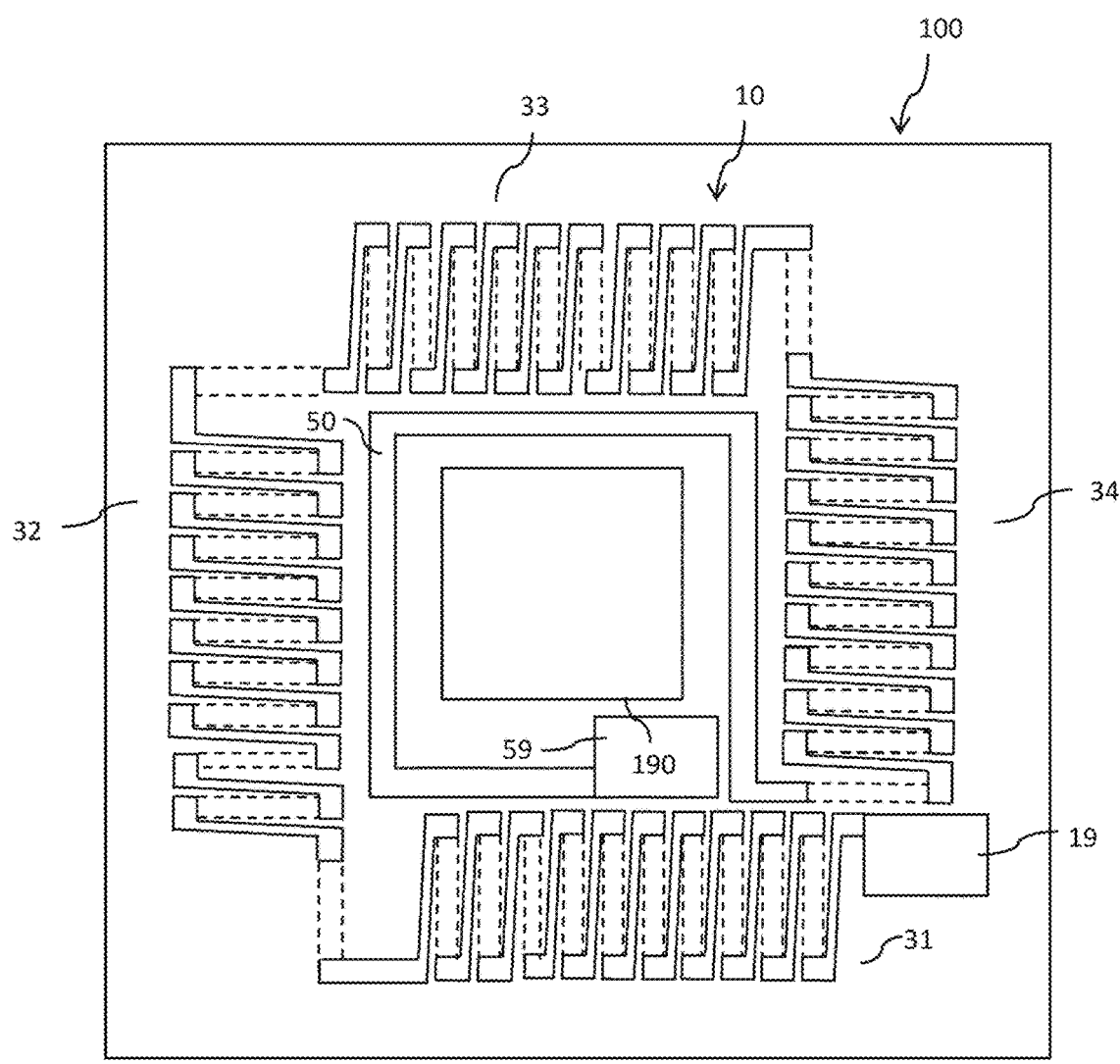
FIG. 13 is a plan view of a detection part that can be used in the fifth embodiment of the present invention.
Figure 14:
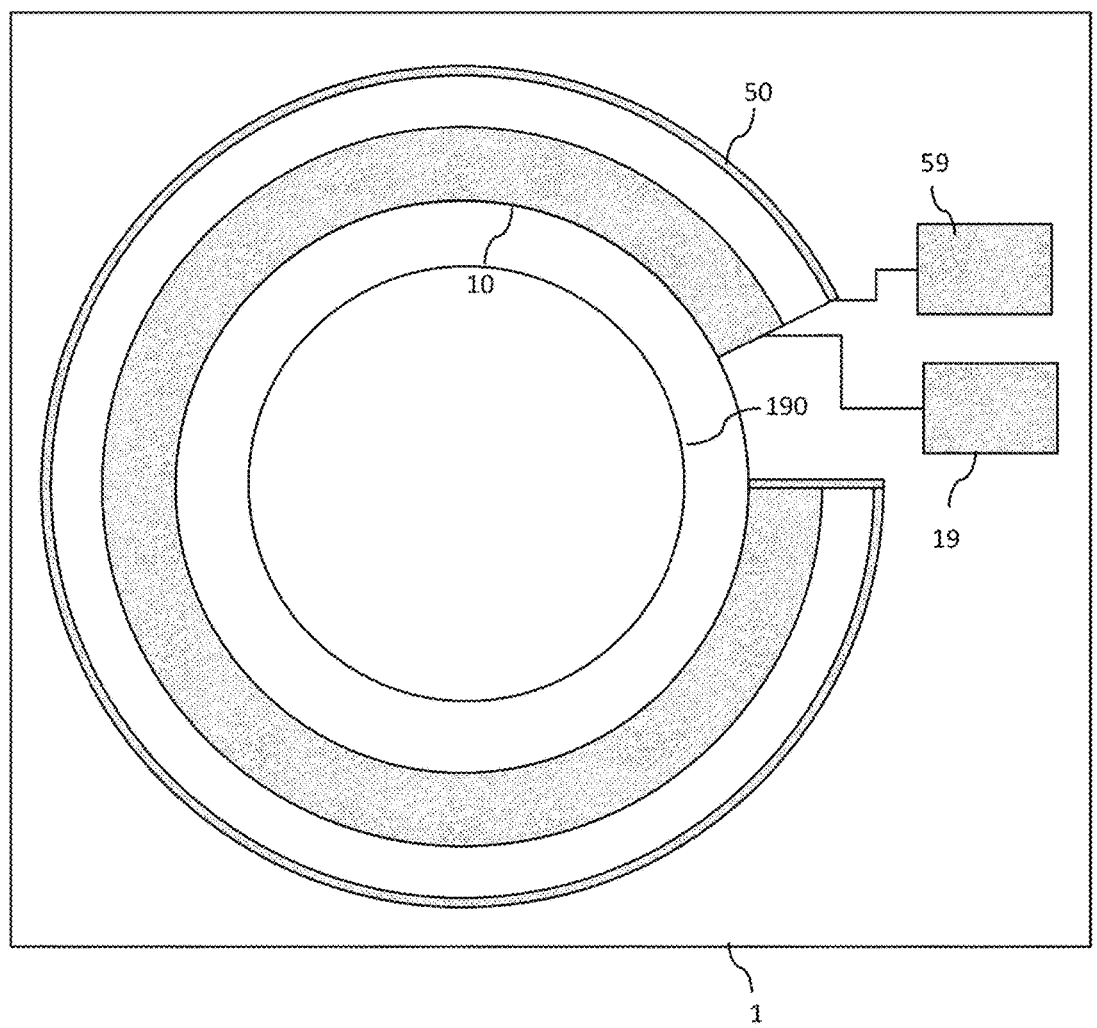
FIG. 14 is a plan view of a detection part that can be used in the fifth embodiment of the present invention in an aspect different from that of FIG. 13.
Figure 14:
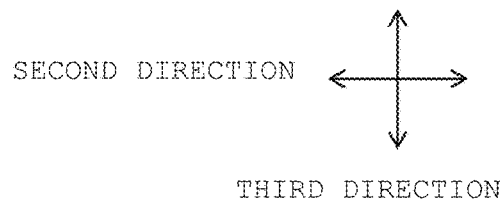

In the first embodiment, as an example, the detection part 100 is configured as shown in FIG. 2. As shown in FIG. 13, an aspect in which the winding return wire part 50 is provided inside the peripheral edge of the winding wire part 10 may be used. Further, as shown in FIG. 14, each of the winding wire part 10 and the winding return wire part 50 may have a circular shape in a plan view (a plane including the second direction and the third direction). Further, each of the winding wire part 10 and the winding return wire part 50 may have a triangular shape in a plan view. Any configuration used in each of the above embodiments can also be used in the embodiment.

Sixth Embodiment

Next, a sixth embodiment of the present invention will be described.

In the above respective embodiments, one quasi Rogowski coil or Rogowski coil is provided. In contrast, in the sixth embodiment, a plurality of quasi Rogowski coils or Rogowski coils are provided. Any configurations adopted in the above respective embodiments can also be adopted in the present embodiment. The members described in each of the above respective embodiments will be described with the same reference numerals.

Figure 15:
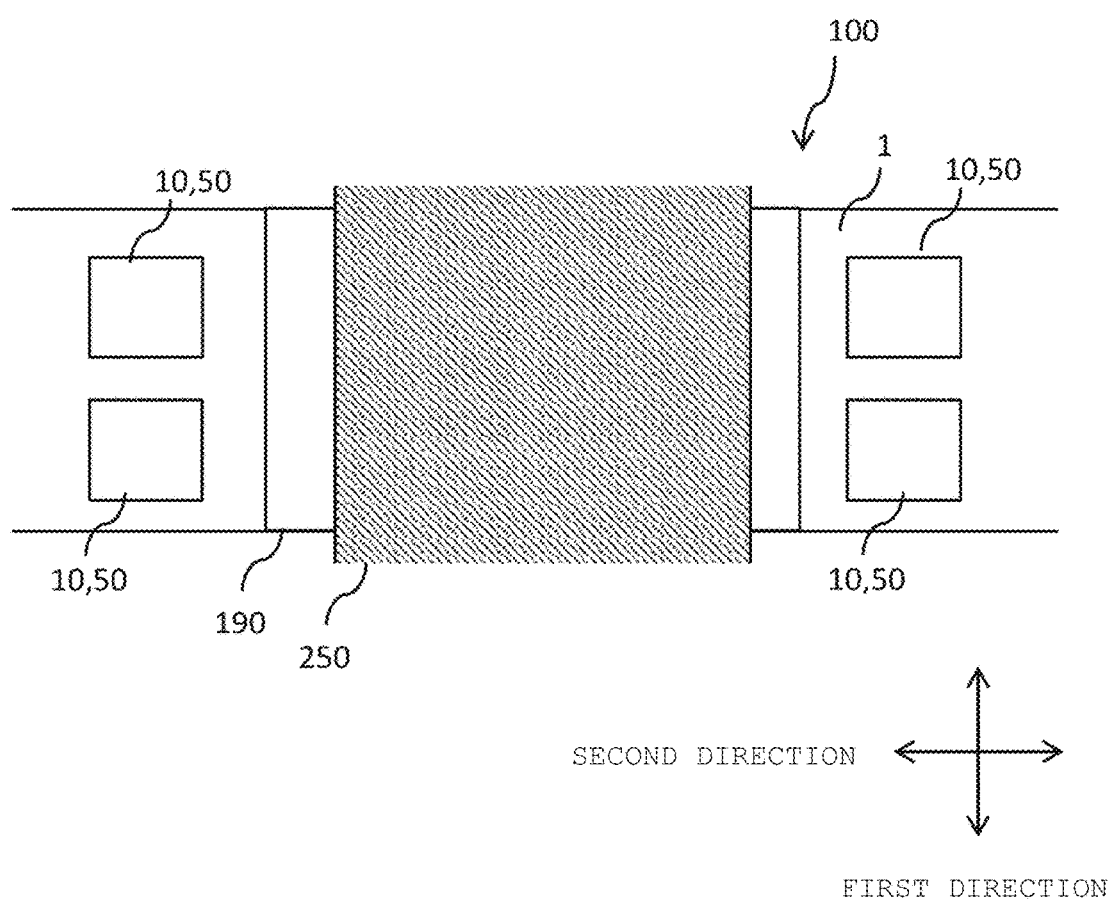
FIG. 15 is a vertical cross section of a semiconductor device that can be used in the sixth embodiment of the present invention.

As shown in FIG. 15, quasi Rogowski coils or Rogowski coils may be aligned in the first direction. More specifically, the winding wire part 10 and the winding return wire part 50 which does not pass through the winding wire part 10 (a quasi Rogowski coil), or the winding wire part 10 and the winding return wire part 50 passing through the winding wire part 10 (Rogowski coil) may be aligned in the first direction. When this aspect is adopted, a change in current can be detected at two or more locations in the first direction, which is advantageous in that a change in current can be detected more accurately. However, in this aspect, it should be noted that, since the winding wire part 10 and the winding return wire part 50 need to be arranged so as to be stacked in the first direction, the manufacturing process becomes complicated as compared with the first embodiment.

Figure 16:
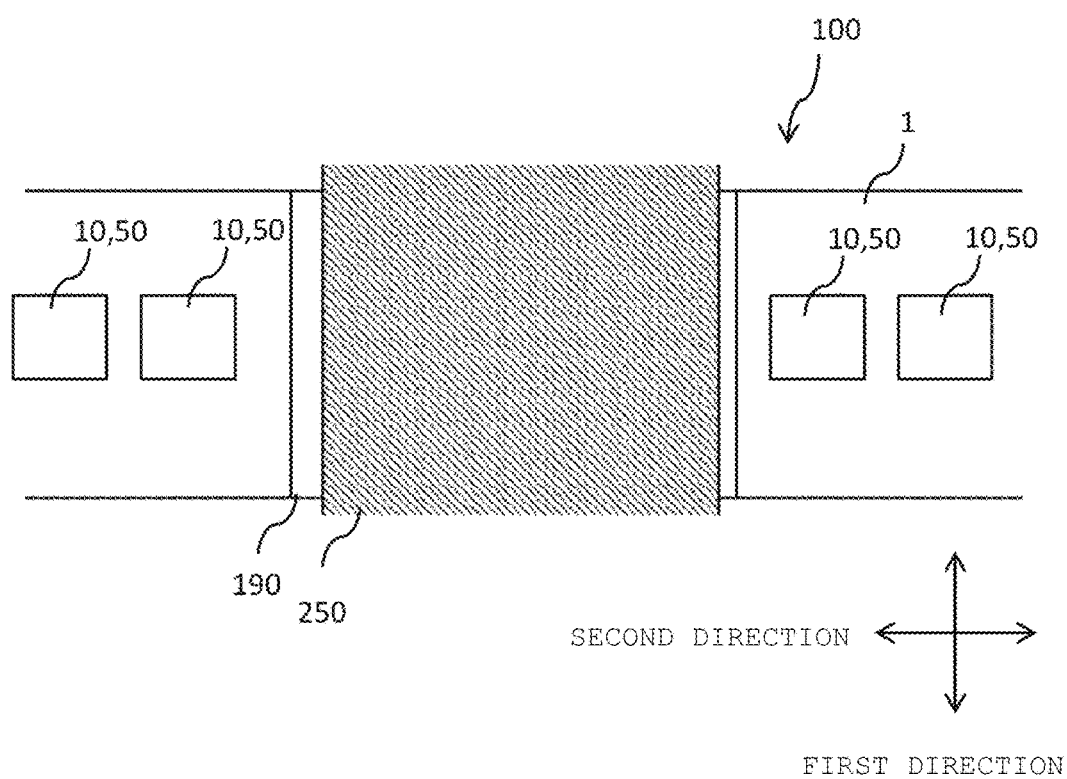
FIG. 16 is a vertical cross section of another semiconductor device that can be used in the sixth embodiment of the present invention in an aspect different from that of FIG. 15.

As shown in FIG. 16, another quasi Rogowski coil or Rogowski coil may be disposed on the outer peripheral side of the quasi Rogowski coil or Rogowski coil. More specifically, the winding wire part 10 and the winding return wire part 50 which does not pass through the winding wire part 10 (quasi Rogowski coil), or the winding wire part 10 and the winding return wire part 50 passing through the winding wire part 10 (Rogowski coil) may be aligned in the second direction or the third direction. When this aspect is adopted, a change in current can also be detected more accurately, which is advantageous. In addition, this aspect is also advantageous in that the similar manufacturing process as that of the first embodiment can be employed.

Figure 17:
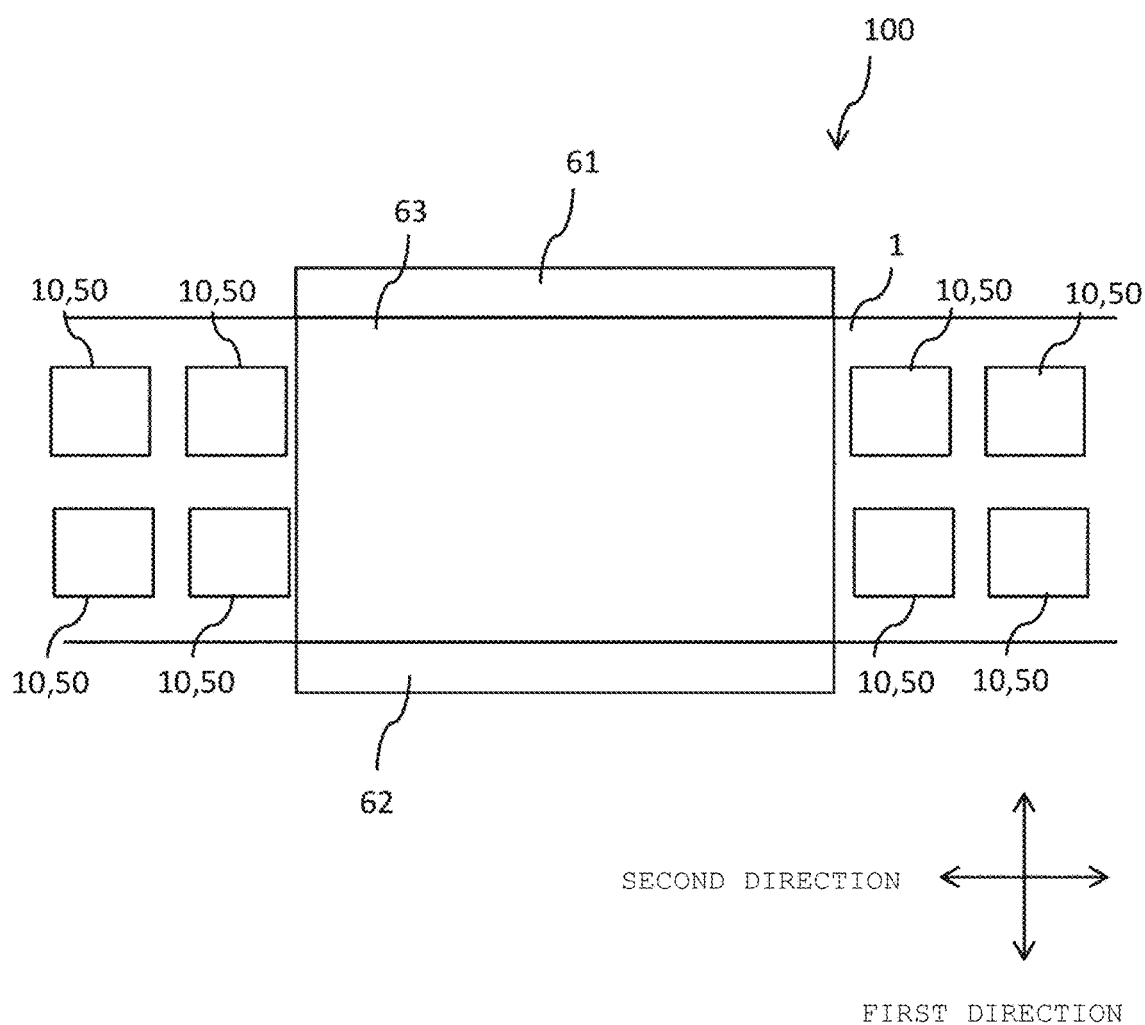
FIG. 17 is a vertical cross section of a semiconductor device that can be used in the sixth embodiment of the present invention in an aspect different from those of FIGS. 15 and 16.

These aspects may be combined, and as shown in FIG. 17, the quasi Rogowski coils or Rogowski coils may be stacked in the first direction, and other quasi Rogowski coils or Rogowski coils may be provided on the outer peripheral side of the quasi Rogowski coils or Rogowski coils. More specifically, the winding wire parts 10 and the winding return wire parts 50 which do not pass through the winding wire parts 10 (quasi Rogowski coils), or the winding wire parts 10 and the winding return wire parts 50 passing through the winding wire parts 10 (Rogowski coils) may be aligned in the second direction or the third direction, and also aligned in the first direction. In addition, in FIGS. 15 and 16, an aspect in which the opening 190 is provided, and the connection body 250 passes through the opening 190 is described, and in FIG. 17, an aspect in which a first element electrode 61, a second element electrode 62, and the conductor part 63 are provided is described.

Seventh Embodiment

Next, the seventh embodiment of the present invention will be described.

Figure 18:
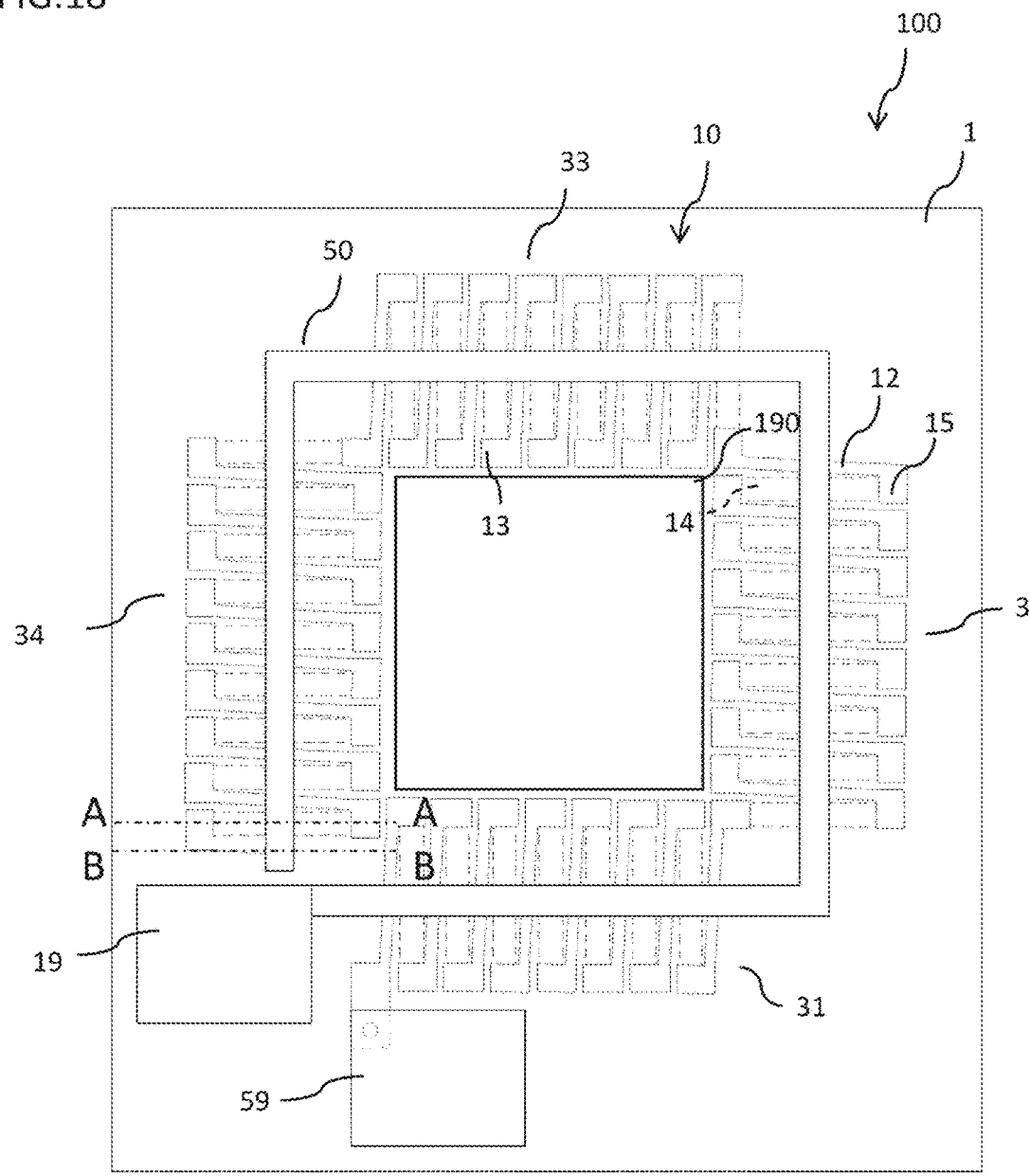
FIG. 18 is a plan view of a detection part that can be used in the seventh embodiment of the present invention.
Figure 18:
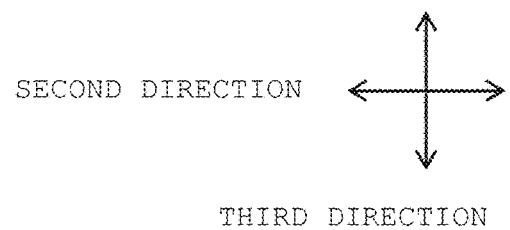
Figure 19:
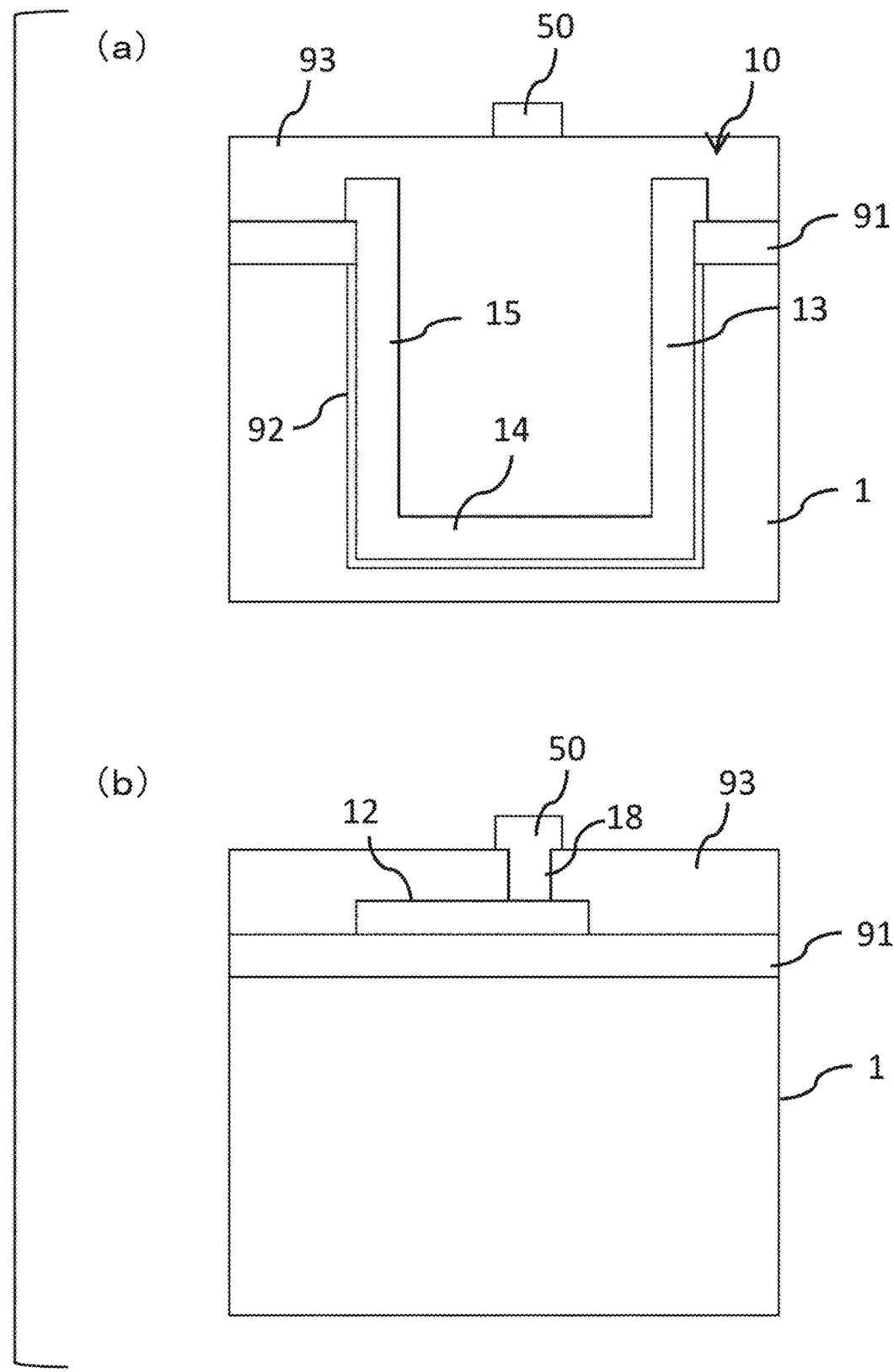
FIG. 19(a) is a vertical cross-sectional view taken along straight line A-A of FIG. 18, and FIG. 19 (b) is a vertical cross-sectional view taken along straight line B-B of FIG. 18.

In the present embodiment, as shown in FIGS. 18 and 19, the winding return wire part 50 is positioned on the one side of the winding wire part 10. Any configuration used in each of the above embodiments can also be used in the embodiment. The members described in each of the above embodiments will be described with the same reference numerals. As a modification of the present embodiment, the winding return wire part 50 may be positioned on the other side of the winding wire part 10.

As shown in FIG. 19, the terminal end part of the winding wire part 10 and the starting end part of the winding return wire part 50 may be connected by a connecting body 18 extending in the first direction. The conductive material used to form the connecting body 18 may be the same material as the conductive material used when forming the winding wire part 10, or may be a different material.

The foregoing descriptions of the embodiments and the disclosure of the drawings are merely one example for describing the present invention recited in the claims. The present invention recited in the claims shall not be limited by the foregoing descriptions of the embodiments and the disclosure of the drawings. Further, the recitations of the claims at the time of the filing of the present application are merely an example, and the recitations of the claims can be changed as appropriate based on the description of the specification, the drawings, and the like.

REFERENCE SIGNS LIST

1 semiconductor layer
10 winding wire part
10*a* first winding wire part
10*b* second winding wire part
50 winding return wire part
50*a* first winding return wire part
50*b* second winding return wire part
61 first detection electrode
62 second detection electrode
63 conductor part
100 detection part
100*a* first detection part
100*b* second detection part
210 electronic element
210*a* first electronic element
210*b* second electronic element
211*b* second element electrode
250, 260 connection body
261 head part
262 pillar part
270*a* first connection body
270*b* second connection body

The invention claimed is:

1. An electronic module comprising:
an electronic element;
a connection body provided on a front face of the electronic element; and
a detection part having a winding wire part provided so as to surround the connection body, and a winding return wire part connected to a terminal end part of the winding wire part and returns from the terminal end part toward a starting end part,
wherein the winding return wire part does not pass through the winding wire part in the detection part.

2. The electronic module according to claim 1, wherein the connection body has a head part and a pillar part extending from the head part in a thickness direction of the head part, and
the winding wire part and the winding return wire part are provided so as to surround the pillar part.

3. The electronic module according to claim 2, wherein the electronic element has a first electronic element on which the pillar part is provided, and a second electronic element which is provided on the head part.

4. An electronic module comprising:
an electronic element;
a connection body provided on a front face of the electronic element; and
a detection part having a winding wire part provided so as to surround the connection body, and a winding return wire part connected to a terminal end part of the winding wire part and returns from the terminal end part toward a starting end part, wherein
the electronic element has a first electronic element and a second electronic element provided in a front face side of the first electronic element,
the connection body has a first connection body provided on a front face of the first electronic element, and a second connection body provided on a front face of the second electronic element, and
the detection part has a first detection part having a first winding wire part and a first winding return wire part surrounding the first connection body, and a second detection part having a second winding wire part and a second winding return wire part surrounding the second connection body.

5. The electronic module according to claim 4, wherein the second connection body is a connector connected to a front face of the second electronic element.

6. The electronic module according to claim 4, wherein the first connection body has a head part and a pillar part extending from the head part in a thickness direction of the head part,
the pillar part is provided on a front surface of the first electronic element, and
the second electronic element is provided on the head part.

7. An electronic module comprising:
an electronic element having a second element electrode provided on a back face side; and
a detection part having a first detection electrode on which the second element electrode of the electronic element is placed, a conductor part through which current flowing into the electronic element passes, a winding wire part provided so as to surround the conductor part, and a winding return wire part which is connected at a terminal end part of the winding wire part and returns from the terminal end part toward a starting end part,
wherein the winding return wire part does not pass through the winding wire part in the detection part.

* * * * *